United States Patent
Wang et al.

(10) Patent No.: US 10,332,776 B2
(45) Date of Patent: Jun. 25, 2019

(54) BEARING SUBSTRATE, FABRICATION METHOD FOR FLEXIBLE DISPLAY

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhidong Wang, Beijing (CN); Xiaofeng Yin, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/763,438

(22) PCT Filed: Jun. 30, 2017

(86) PCT No.: PCT/CN2017/091116
§ 371 (c)(1),
(2) Date: Mar. 26, 2018

(87) PCT Pub. No.: WO2018/045800
PCT Pub. Date: Mar. 15, 2018

(65) Prior Publication Data
US 2018/0277414 A1    Sep. 27, 2018

(30) Foreign Application Priority Data
Sep. 8, 2016 (CN) .......................... 2016 1 0809635

(51) Int. Cl.
*H01L 51/00* (2006.01)
*G02F 1/1333* (2006.01)
(Continued)

(52) U.S. Cl.
CPC ........ *H01L 21/6835* (2013.01); *G02F 1/1368* (2013.01); *G02F 1/133305* (2013.01);
(Continued)

(58) Field of Classification Search
CPC ........... H01L 2227/326; H01L 21/6835; H01L 21/683; H01L 27/1266; C23C 1414/50
See application file for complete search history.

(56) References Cited

U.S. PATENT DOCUMENTS

2001/0005043 A1* 6/2001 Nakanishi ........... H01L 21/6835
                                                    257/678
2004/0247084 A1   12/2004 Alzner
(Continued)

FOREIGN PATENT DOCUMENTS

CN    102810512 A    12/2012
CN    102856167 A    1/2013
(Continued)

OTHER PUBLICATIONS

Office Action received for Chinese Patent Application No. 201610809635.5, dated Oct. 13, 2017, 10 pages (6 pages of English Translation and 4 pages of Office Action).
(Continued)

*Primary Examiner* — Charles D Garber
*Assistant Examiner* — Alia Sabur
(74) *Attorney, Agent, or Firm* — Womble Bond Dickinson (US) LLP

(57) ABSTRACT

Embodiments of the disclosure provide a bearing substrate and a fabrication method for a flexible display device, which relate to the field of display technology and may achieve a uniform separation between a flexible substrate and bearing substrate, and not cause damage to the flexible substrate and the display element. The bearing substrate comprises a first sub-bearing substrate and a second sub-bearing substrate.

(Continued)

The first sub-bearing substrate has a plurality of through holes, and the second sub-bearing substrate has a plurality of protrusions that are in one-to-one correspondence with the protrusions. The protrusions and the through holes are configured such that the protrusions are capable of passing through the through holes when assembling the first sub-bearing substrate with the second sub-bearing substrate, so that the protrusions are flush with a surface of the first sub-bearing substrate and spliced together with the surface.

11 Claims, 6 Drawing Sheets

(51) Int. Cl.
   *H01L 21/683* (2006.01)
   *H01L 27/32* (2006.01)
   *G02F 1/1368* (2006.01)
(52) U.S. Cl.
   CPC ...... *H01L 27/3244* (2013.01); *H01L 51/0097* (2013.01); *H01L 51/003* (2013.01); *H01L 2221/68377* (2013.01); *H01L 2221/68381* (2013.01); *H01L 2227/326* (2013.01); *H01L 2251/5338* (2013.01)

(56) References Cited

U.S. PATENT DOCUMENTS

| | | | |
|---|---|---|---|
| 2008/0111938 A1 | 5/2008 | Park et al. | |
| 2015/0075705 A1* | 3/2015 | Qiao | H01L 51/5246 156/247 |

FOREIGN PATENT DOCUMENTS

| | | | | |
|---|---|---|---|---|
| CN | 105549338 A | 5/2016 | | |
| CN | 105629681 A | 6/2016 | | |
| CN | 106298620 A | 1/2017 | | |
| JP | 4799274 B2 | 10/2011 | | |
| WO | WO-2013114616 A1 * | 8/2013 | ............ | B41F 15/26 |

OTHER PUBLICATIONS

Office Action received for Chinese Patent Application No. 201610809635.5, dated May 2, 2017, 11 pages (5 pages of English Translation and 6 pages of Office Action).
Office Action received for Chinese Patent Application No. 201610809635.5, dated Jul. 24, 2017, 10 pages (6 pages of English Translation and 4 pages of Office Action).
Office Action received for Chinese Patent Application No. 201610809635.5, dated Jan. 16, 2018, 9 pages (6 pages of English Translation and 3 pages of Office Action).
International Search Report received for PCT Patent Application No. PCT/CN2017/091116, dated Sep. 19, 2017, 5 pages (2 pages of English Translation and 3 pages of Original Document).
Written Opinion received for PCT Patent Application No. PCT/CN2017/091116, dated Sep. 19, 2017, 4 pages of Original Document Only.
Chinese Search Report received for Chinese Patent Application No. 2016108096355, dated Feb. 16, 2017, 9 pages (3 pages of English Translation and 6 pages of Office Action).

* cited by examiner laser light

BEARING SUBSTRATE, FABRICATION METHOD FOR FLEXIBLE DISPLAY

CROSS REFERENCE TO RELATED APPLICATION

This application is the U.S. national phase entry of PCT/CN2017/091116, with an international filling date of Jun. 30, 2017, which claims the priority benefits of the patent application No. 201610809635.5 filed to the Chinese Patent Office on Sep. 8, 2016, the disclosure of which is incorporated herein by reference.

TECHNICAL FIELD

The disclosure relates to the field of display technology, and in particular, to a bearing substrate and a fabrication method for a flexible display device.

BACKGROUND

A flexible display device has advantages such as curved display, portability, lightweight and thin, good mechanical performances, and so on, so it is widely applied in mobile terminal products of winding-type.

Since the flexible substrate in the flexible display device is easy to deform, it is relatively difficult to position, transport and store the flexible substrate during the process of fabricating the display device, generally, the flexible substrate is first formed on a bearing substrate such as a glass substrate, etc., then display elements are formed thereon, and finally, the flexible substrate is caused to be separated from the glass substrate by way of stripping.

At present, common stripping methods involve a method in a mechanical manner as shown in FIG. 1(a) and a method using laser light as shown in FIG. 1(b). However, certain problems exist in these stripping methods. For example, with the method in a mechanical manner, the flexible substrate is prone to damage during the stripping process. For the method using laser light, it is possible that a part of the laser light passes through the flexible substrate and reaches the display elements during the stripping process, thereby affecting the characteristic (e.g., the threshold voltage, etc.) of the display elements. In addition, the non-uniformity in distribution of the laser light may also cause damage to the flexible substrate.

SUMMARY

Embodiments of the disclosure provide a bearing substrate and a fabrication method for a flexible display device, to mitigate or alleviate the above-mentioned problems existing in the prior art.

In an aspect, an embodiment of the disclosure provides a bearing substrate comprising a first sub-bearing substrate and a second sub-bearing substrate. The first sub-bearing substrate has a plurality of through holes, and the second sub-bearing substrate has a plurality of protrusions that are in one-to-one correspondence with the through holes. The protrusions and the through holes are configured such that the protrusions are capable of passing through the through holes when assembling the first sub-bearing substrate with the second sub-bearing substrate, so that the protrusions are flush with a surface of the first sub-bearing substrate and spliced together with the surface.

In some embodiments, an orthographic projection area of the second sub-bearing substrate is greater than that of the first sub-bearing substrate along a direction perpendicular to a bearing surface of the bearing substrate when the first sub-bearing substrate is assembled with the second sub-bearing substrate.

In some embodiments, a height of each of the protrusions is equal to a depth of each of the through holes.

In some embodiments, a height of each of the protrusions is greater than a depth of each of the through holes.

In some embodiments, the bearing substrate further comprises a spacer layer covering a surface of the second sub-bearing substrate facing the first sub-bearing substrate, and the protrusions pass through the spacer layer; and the height of the protrusions is equal to a sum of the depth of the through holes and a thickness of the spacer layer.

Further, the material of the spacer layer comprises resin.

In some embodiments, each of the through holes and the protrusions has a cylindrical shape.

In another aspect, an embodiment of the disclosure provides a fabrication method for a flexible display device, comprising: forming an adhesive layer on the bearing surface of a bearing substrate as described above; forming a flexible substrate on the adhesive layer, and forming a display element on the flexible substrate, separating the first sub-bearing substrate of the bearing substrate from the second sub-bearing substrate thereof, and removing the adhesive layer by flowing a cleaning liquid through the through holes in the first sub-bearing substrate, such that the first sub-bearing substrate is separated from the flexible substrate and the flexible display device is formed. The cleaning liquid does not react with the first sub-bearing substrate and the flexible substrate.

In some embodiments, separating the first sub-bearing substrate of the bearing substrate from the second sub-bearing substrate thereof comprises: separating the first sub-bearing substrate from the second sub-bearing substrate in a mechanistic fashion or by means of electrostatic force.

Alternatively, in some embodiments, an orthographic projection area of the second sub-bearing substrate is greater than that of the first sub-bearing substrate along a direction perpendicular to a bearing surface of the bearing substrate when the first sub-bearing substrate is assembled with the second sub-bearing substrate, and separating the first sub-bearing substrate of the bearing substrate from the second sub-bearing substrate thereof comprises applying an inert gas to an edge of the second sub-bearing substrate from above, so as to separate the first sub-bearing substrate from the second sub-bearing substrate by means of a gas pressure.

In some embodiments, the material of the adhesive layer comprises an organosilicon polymer material.

In some embodiments, the display element comprises one of an OLED display element and a liquid crystal display element.

BRIEF DESCRIPTION OF THE DRAWINGS

In order to more clearly illustrate the technical solutions in embodiments of the disclosure, the drawings mentioned in the specification will be introduced briefly in the following. The drawings in the following description are only some embodiments of the disclosure. For a person having an ordinary skill in the art, other drawings may also be obtained based on these drawings without creative efforts.

DETAILED DESCRIPTION OF EMBODIMENTS

In the following, technical solutions of embodiments of the disclosure will be described clearly and completely in connection with the drawings. The embodiments described herein are just some of the embodiments of the invention, rather than all the embodiments. All other embodiments obtained by a person having an ordinary skill in the art based on the embodiments in the disclosure without creative effort pertain to the scope of the invention.

In the description below, the following reference signs may be mentioned:
01 first sub-bearing substrate; 02 second sub-bearing substrate; 03 through hole; 04 protrusion; 05 spacer layer; 10 adhesive layer; 11 flexible substrate; 12 display element.

Figure 1:
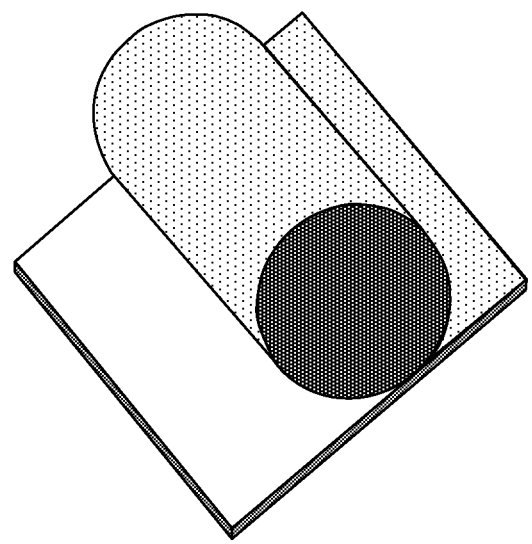
FIG. 1(a) is a schematic view showing a way of stripping a flexible substrate in the prior art.
FIG. 1(b) is a schematic view showing another way of stripping a flexible substrate in the prior art.
Figure 1:
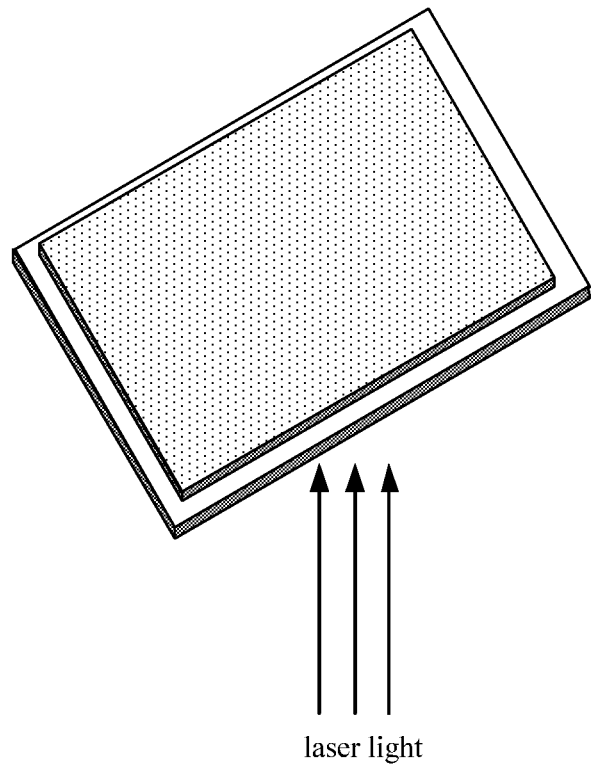
Figure 2A:
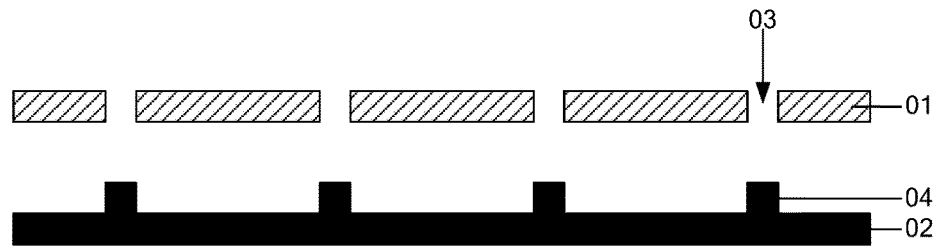
FIG. 2(a) is a schematic sectional view for the bearing substrate provided by an embodiment of the disclosure for which the first sub-bearing substrate is separated from the second sub-bearing substrate.

An embodiment of the disclosure provides a bearing substrate, as shown in FIGS. 2(a) and 2(b), comprising a first sub-bearing substrate 01 and a second sub-bearing substrate 02. The first sub-bearing substrate 01 has a plurality of through holes 03, and the second sub-bearing substrate 02 has a plurality of protrusions 04. The protrusions 04 are in one-to-one correspondence with the through holes 03. The protrusions 04 can pass through the through holes 03, so that the protrusions 04 are flush with a surface of the first sub-bearing substrate 01, and the protrusions 04 are spliced together with the surface of the first sub-bearing substrate 01.

It needs to be noted that, the materials of the first sub-bearing substrate 01 and the second sub-bearing substrate 02 will not be limited herein, as long as they can play a bearing role in the process of fabricating a flexible display device. Moreover, the number of the through holes 03 in the first sub-bearing substrate 01 and the distribution of the through holes 03 will not be limited. Optionally, the through holes 03 may be distributed uniformly. Correspondingly, the number of the protrusions 04 of the second sub-bearing substrate 02 and the arrangement thereof will not be limited, either, it is only required that the protrusions 04 are in one-to-one correspondence with the through holes 03.

For the bearing substrate provided by the embodiment of the disclosure, when the first sub-bearing substrate 01 is assembled with the second sub-bearing substrate 02, the protrusions 04 will pass through the through holes 03 and be flush with a surface of the first sub-bearing substrate 01, which surface is a surface of the first sub-bearing substrate 01 facing away from the second sub-bearing substrate 02 and may act as the bearing surface for bearing a flexible display device. In this embodiment, the bearing surface of the bearing substrate is a surface of the first sub-bearing substrate 01 facing away from the second sub-bearing substrate 02 after the first sub-bearing substrate 01 is assembled with the second sub-bearing substrate 02. It may be appreciated that, alternatively, the bearing surface of the bearing substrate may also be a surface of the second sub-bearing substrate 02 facing away from the first sub-bearing substrate 01 after the first sub-bearing substrate 01 is assembled with the second sub-bearing substrate 02. When fabricating a flexible display device by means of the bearing substrate, the flexible substrate and the display elements are placed on the bearing surface of the bearing substrate.

In addition, shapes of the through holes 03 and the protrusions 04 will not be limited herein, as long as the protrusions 04 can pass through the through holes 03 so that they are flush with a surface of the first sub-bearing substrate 01, and spliced together with the surface when the first sub-bearing substrate 01 is assembled with the second sub-bearing substrate 02.

Figure 3:
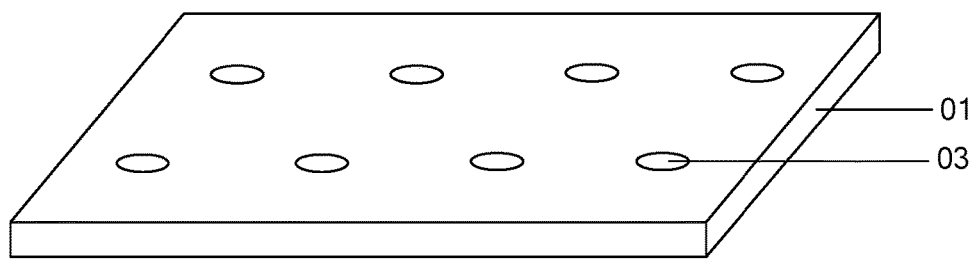
FIG. 3(a) is a structure view of a bearing substrate provided by an embodiment of the disclosure.
FIG. 3(b) is a structure view of a bearing substrate provided by another embodiment of the disclosure.
Figure 3:
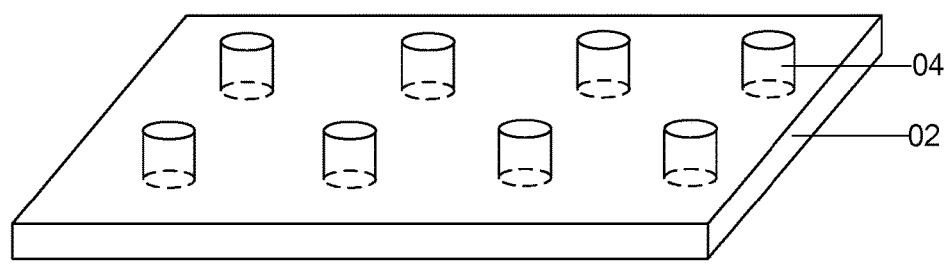
Figure 3:
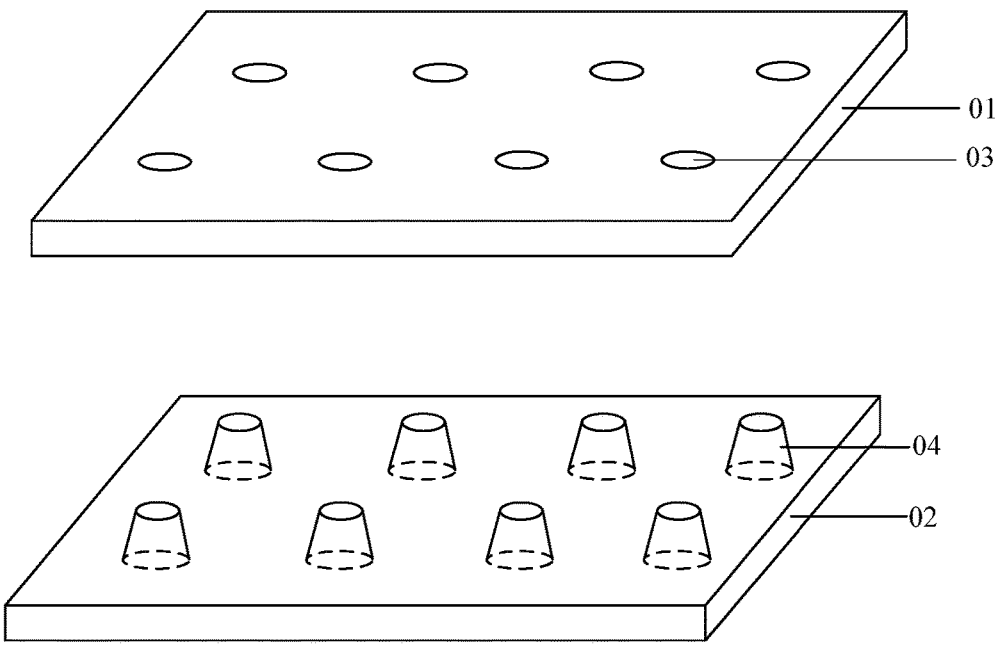

As an example shown in FIG. 3(a), the protrusion 04 may have a shape of a cylinder, and the through hole 03 may also be cylindrical accordingly. As shown in FIG. 3(b), the protrusions 04 may be in a shape of a truncated cone, accordingly, the shape of the through hole 03 may be a truncated cone. Of course, it is not required that the shape of the protrusions 04 must be the same as that of the through holes 03. In other embodiments, the protrusion 04 may have a shape different from the through hole, and in this case, it is possible that only the portion of the protrusion 04 close to the splicing surface fits the through hole 03, alternatively, it is possible that the whole side wall of the protrusion 04 fits the through holes 03.

The expression "the protrusions are spliced together with the surface" mentioned herein means that the protrusions 04 pass through the through holes 03 and are spliced together with the surface of the first sub-bearing substrate 01 to form a complete surface that is substantially flat and seamless.

With the bearing substrate provided by the embodiment of the disclosure, the bearing substrate is configured to comprise a first sub-bearing substrate 01 and a second sub-bearing substrate 02, when the bearing substrate is applied in producing a flexible display device, it may be possible to first form an adhesive layer on the bearing surface of the bearing substrate, and afterwards, form the flexible display device on the adhesive layer. In this way, to strip the flexible substrate from the bearing substrate subsequently, it is possible to firstly separate the second sub-bearing substrate 02 from the first sub-bearing substrate 01, and afterwards, clean out the material of the adhesive layer with cleaning liquid provided from the through holes 03 in the first sub-bearing substrate 01, thereby achieving separation of the first sub-bearing substrate 01 from the flexible display device. As compared to the conventional mechanical method or method using laser light, the embodiments of the disclosure may achieve a uniform separation of the flexible substrate from the bearing substrate, and will not cause damage to the display elements. Additionally, by selecting a suitable material for the adhesive layer, damage to the flexible substrate and the first sub-bearing substrate 01 may be avoided.

In an embodiment, the thickness of the first sub-bearing substrate 01 is 0.3~0.7 mm, and the thickness of the second sub-bearing substrate 02 without the protrusions 04 is 0.3~0.7 mm. The thicknesses of the first sub-bearing substrate 01 may be the same as that of the second sub-bearing substrate 02 without the protrusions 04, alternatively, they may be different. Thus, it is adequate for the assembled first sub-bearing substrate 01 and second sub-bearing substrate 02 to play a supporting role in the process of fabricating a flexible display device, and the waste of the material due to a too large thickness may be avoided.

Figure 4:
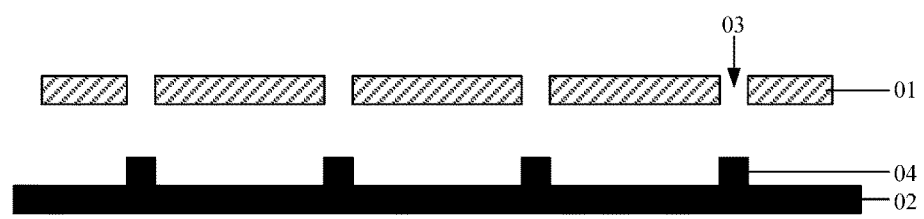
FIG. 4(a) is a schematic sectional view for the bearing substrate provided by a further embodiment of the disclosure for which the first sub-bearing substrate is separated from the second sub-bearing substrate.
FIG. 4(b) is a schematic sectional view for the bearing substrate provided by the embodiment as shown in FIG. 4(a) for which the first sub-bearing substrate is assembled with the second sub-bearing substrate.
Figure 4B:

In some embodiments, as shown in FIGS. 4(*a*) and 4(*b*), the orthographic projection area of the second sub-bearing substrate 02 is greater than that of the first sub-bearing substrate 01 along a direction perpendicular to the splicing surface of the first sub-bearing substrate 01 and the second sub-bearing substrate 02 (i.e., along a direction perpendicular to the bearing surface of the bearing substrate). That is, in case the first sub-bearing substrate 01 is assembled with the second sub-bearing substrate 02, the orthographic projection of the second sub-bearing substrate 02 fully covers that of the first sub-bearing substrate 01.

Further, in some embodiments, the length of each side of the orthographic projection of the second sub-bearing substrate 02 in the direction perpendicular to the bearing surface is greater than that of a corresponding side of the orthographic projection of the first sub-bearing substrate 01. That is to say, in the embodiment, as compared with the first sub-bearing substrate 01, the size of the second sub-bearing substrate 02 is larger, and as such, it is easier for the separation between the first sub-bearing substrate 01 and second sub-bearing substrate 02 after assembled.

Figure 2:
FIG. 2(b) is a schematic sectional view for the bearing substrate provided by the embodiment as shown in FIG. 2(a) for which the first sub-bearing substrate is assembled with the second sub-bearing substrate.

As shown in FIGS. 2(*a*) and 2(*b*), in some embodiments, the height of the protrusion 04 is equal to the depth of the through hole 03. By setting the height of the protrusion 04 to be equal to the depth of the through hole 03, it is easy to control the movement of the first sub-bearing substrate 01 or the second sub-bearing substrate 02 at the time of assembling the first sub-bearing substrate 01 with the second sub-bearing substrate 02, so as to ensure that the protrusions 04 of the second sub-bearing substrate 02 pass through the through holes 03 and are flush with the surface of the first sub-bearing substrate 01.

Figure 5:
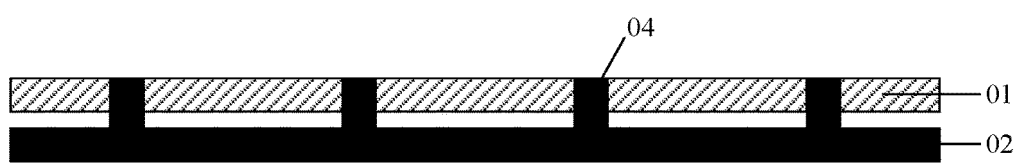
FIG. 5 is a schematic sectional view for the bearing substrate provided by another embodiment for which the first sub-bearing substrate is assembled with the second sub-bearing substrate.
Figure 6:
FIG. 6 is a schematic sectional view for the bearing substrate provided by another embodiment for which the first sub-bearing substrate is assembled with the second sub-bearing substrate.

Optionally, in a further embodiment, as shown in FIG. 5 and FIG. 6, the height of the protrusion 04 is greater than the depth of the through hole 03. Namely, after the first sub-bearing substrate 01 is assembled with the second sub-bearing substrate 02, there is a gap between the first sub-bearing substrate 01 and the second sub-bearing substrate 02.

Considering that if the gap between the first sub-bearing substrate 01 and the second sub-bearing substrate 02 is too large, the space for the device will be wasted excessively in mass production, in an embodiment, the gap between the first sub-bearing substrate 01 and the second sub-bearing substrate 02 may not exceed 0.2 mm.

It needs to be noted that, in the case where the height of the protrusion 04 is greater than the depth of the through hole 03, in order to ensure that, after the assembly, the protrusions 04 of the second sub-bearing substrate 02 pass through the through holes 03 and are flush with the surface of the first sub-bearing substrate 01, it may be possible to adjust the rise and fall of the second sub-bearing substrate 02 or the first sub-bearing substrate 01 by an external adjustment means, to facilitate the protrusions 04 of the second sub-bearing substrate 02 to pass through the through holes 03 to be flush with the surface of the first sub-bearing substrate 01.

In addition, for this embodiment of the disclosure in which a gap exists between the first sub-bearing substrate 01 and the second sub-bearing substrate 02 after the first sub-bearing substrate 01 is assembled with the second sub-bearing substrate 02, it can be prevented that the first sub-bearing substrate 01 and the second sub-bearing substrate 02 stick together.

Figure 7:
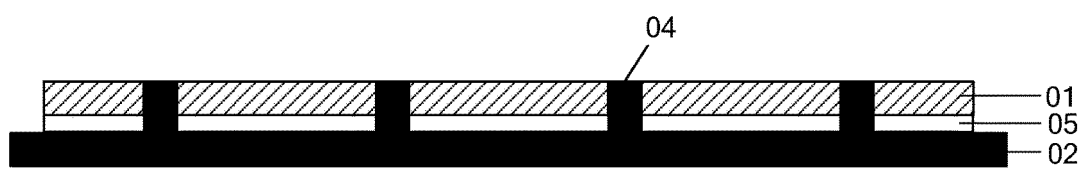
FIG. 7 is a schematic sectional view for the bearing substrate provided by yet another embodiment for which the first sub-bearing substrate is assembled with the second sub-bearing substrate.

In a further embodiment, as shown in FIG. 7, the bearing substrate further comprises a spacer layer 05 covering a surface of the second sub-bearing substrate 02 facing the first sub-bearing substrate 01, the protrusions 04 may pass through the spacer layer 05, and the height of the protrusion 04 is equal to the sum of the depth of the through hole 03 and the thickness of the spacer layer 05.

In this embodiment, the spacer layer 05 is provided with holes that are in one-to-one correspondence with the protrusions 04. In addition, the material for the spacer layer 05 will not be limited herein, as long as the spacer layer 05 will not stick to the first sub-bearing substrate 01, and will not damage the first sub-bearing substrate 01 and the second sub-bearing substrate 02.

For this embodiment of the disclosure, by disposing protrusions 04 on the second sub-bearing substrate 02 and a spacer layer 05 covering the first sub-bearing substrate 01, and making the height of the protrusion 04 be equal to the sum of the depth of the through hole 03 with the thickness of the spacer layer 05, not only it may be possible to avoid that the first sub-bearing substrate 01 and the second sub-bearing substrate 02 stick together, but also it is easier to control the movement of the first sub-bearing substrate 01 or the second sub-bearing substrate 02, so as to ensure that after the assembly, the protrusions 04 of the second sub-bearing substrate 02 pass through the through holes 03 and are flush with the surface of the first sub-bearing substrate 01.

Further, in some embodiments, the material for the spacer layer 05 is a resin material. The chemical stability of the resin material is strong, so the spacer layer will not cause damage to the first sub-bearing substrate 01 and the second sub-bearing substrate 02 in contact with it. Moreover, considering that it is easy to make cylindrical through holes 03 and protrusions 04, the shapes of the through holes 03 and the protrusions 04 in the embodiment of the disclosure may be cylindrical.

Figure 8:
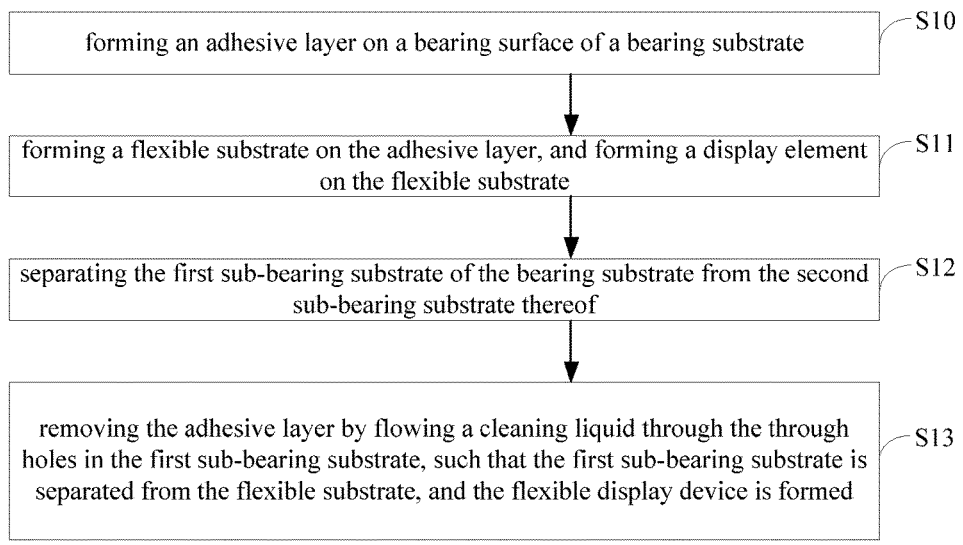
FIG. 8 is a schematic flow chart of fabricating a flexible display device provided by an embodiment of the disclosure.

A further embodiment of the disclosure provides a fabrication method for a flexible display device, as shown in FIG. 8, comprising the following steps.

Figure 9:
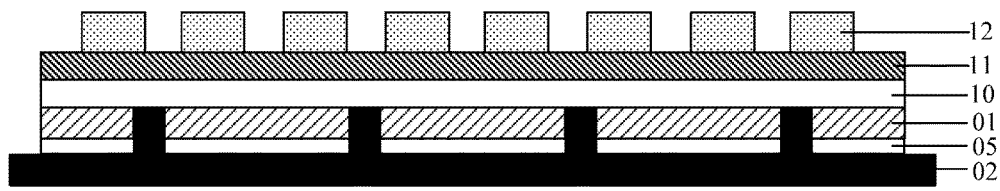
FIGS. 9-11 illustrate a process of fabricating a flexible display device provided by an embodiment of the disclosure.

At S10, as shown in FIG. 9, forming an adhesive layer 10 on the splicing surface of a bearing substrate as described above. Here, the splicing surface is right the surface of the first sub-bearing substrate 01 far away from the second sub-bearing substrate 02, also the bearing surface of the bearing substrate.

At S11, as shown in FIG. 9, forming a flexible substrate 11 on the adhesive layer 10, and forming a display element 12 on the flexible substrate 11. Here, the display element 12 will not be limited, and it depends on the type of the flexible display device.

Figure 10:
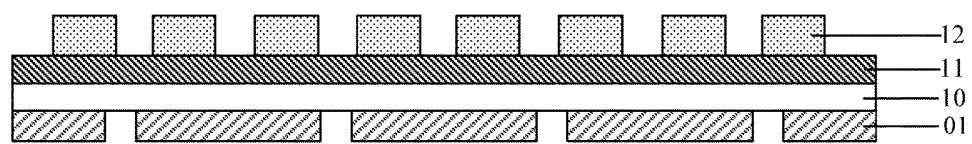

At S12, as shown in FIG. 10, separating the first sub-bearing substrate 01 from the second sub-bearing substrate 02. In case the bearing substrate comprises a spacer layer 05 disposed on the second sub-bearing substrate 02, in the process of separating the first sub-bearing substrate 01 from the second sub-bearing substrate 02, the spacer layer 05 may be separated from the first sub-bearing substrate 01 together with the second sub-bearing substrate 02.

In addition, the manner in which the first sub-bearing substrate 01 is separated from the second sub-bearing substrate 02 will not be limited herein, as long as it will not cause damage to the flexible substrate 11 and the display element 12.

Figure 11:
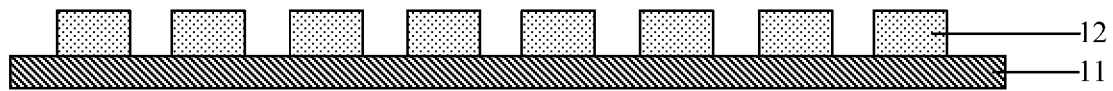

At S13, the adhesive layer 10 is removed by flowing a cleaning liquid through the through holes 03 in the first sub-bearing substrate 01, such that the first sub-bearing substrate 01 is separated from the flexible substrate 11, and the flexible display device as shown in FIG. 11 is formed. The cleaning liquid may be selected not to react with the first sub-bearing substrate 01 and the flexible substrate 11. At this step, the semi-finished product after the step S12 may be placed into the cleaning liquid, such that the cleaning liquid may pass through the through holes 03 in the first sub-bearing substrate 01 to remove the adhesive layer 10.

For the fabrication method for a flexible display device provided by the embodiments of the disclosure, by designing the bearing substrate to comprise a first sub-bearing substrate 01 and a second sub-bearing substrate 02, when the bearing substrate is applied in producing a flexible display device, it may be possible to first form an adhesive layer 10 on the splicing surface (i.e., the bearing surface of the bearing substrate) after the first sub-bearing substrate 01 is assembled with the second sub-bearing substrate 02, and afterwards, successively form a flexible substrate 11 and a display element 12 on the adhesive layer 10. Thus, in order to strip the flexible substrate 11 subsequently, it may be possible to first separate the second sub-bearing substrate 02 from the first sub-bearing substrate 01, and afterwards, clean out the material of the adhesive layer with cleaning liquid provided from the through holes 03 in the first sub-bearing substrate 01, thereby achieving separation of the first sub-bearing substrate 01 from the flexible display device. As compared to the conventional mechanical method or method using laser light, the embodiments of the disclosure may achieve a uniform separation of the flexible substrate from the bearing substrate, and will not cause damage to the display elements. By selecting the materials for the adhesive layer 10 and the cleaning liquid, it may avoid causing damage to the flexible substrate 11 and the first sub-bearing substrate 01, which enables that the bearing substrate may be reused, and thereby reducing the cost.

The fabrication method for a flexible display device described in the above embodiment is discussed based on examples where the bearing surface of the bearing substrate is a surface of the first sub-bearing substrate 01 facing away from the second sub-bearing substrate 02 after the first sub-bearing substrate 01 is assembled with the second sub-bearing substrate 02. However, as described above, in other embodiments, the bearing surface of the bearing substrate may be a surface of the second sub-bearing substrate 02 facing away from the first sub-bearing substrate 01 after the first sub-bearing substrate 01 is assembled with the second sub-bearing substrate 02. In some embodiments, the material for the adhesive layer 10 in the embodiment of the disclosure comprises an organosilicon polymer material, for example, polydimethylsiloxane. The organosilicon polymer material has good chemical inertness, and will not react with the flexible substrate 11 and the bearing substrate. In some embodiments, the first sub-bearing substrate 01 of the bearing substrate may be separated from the second sub-bearing substrate 02 in a mechanistic fashion or by means of electrostatic force. As compared to the convention method in a mechanistic fashion, in the embodiment of the disclosure, since the flexible substrate 11 is fully covered by the first sub-bearing substrate 01, damage will not be caused to the flexible substrate in the process.

Optionally, in a case where the orthographic projection area of the second sub-bearing substrate 02 along a direction perpendicular to the bearing surface of the bearing substrate is greater than the corresponding orthographic projection area of the first sub-bearing substrate 01, separating the first sub-bearing substrate 01 of the bearing substrate from second sub-bearing substrate 02 may comprise the following step: applying an inert gas to the edge of the second sub-bearing substrate 02 from above, so as to separate the first sub-bearing substrate 01 of the bearing substrate from its second sub-bearing substrate 02 by means of the gas pressure.

With the gas pressure, not only the first sub-bearing substrate 01 of the bearing substrate may be caused to be separated from the second sub-bearing substrate 02, but also damage will not be brought to the display element 12, the flexible substrate 11 and the bearing substrate.

In the embodiments of the disclosure, the display element comprises, but is not limited to, an OLED display element or a liquid crystal display element. The OLED display element may comprise a thin film transistor, an anode, a cathode, and a functional layer of organic material between the anode and the cathode. Because of the particularity of the functional layer of organic material, the OLED display element may further comprise an encapsulation layer. The liquid crystal display element comprises a thin film transistor and a pixel electrode, etc. located on an array substrate, and a color filter layer located on an opposite substrate. A common electrode may be disposed on the array substrate, or on the opposite substrate, and the color filter layer may be disposed on the opposite substrate or the array substrate.

What are described above are just some exemplary embodiments of the disclosure, however, the protection scope of the invention is not limited thereto, and variations or alternatives easily occurring to a person having an ordinary skill in the art within the technical scope disclosed by the disclosure should be encompassed within the protection scope of the invention. Therefore, the protection scope of the invention should be to subject to the scope of the appended claims.

The invention claimed is:

1. A fabrication method for a flexible display device, comprising:
providing a bearing substrate comprising a first sub-bearing substrate and a second sub-bearing substrate, wherein the first sub-bearing substrate has a plurality of through holes, and the second sub-bearing substrate has a plurality of protrusions that are in one-to-one correspondence with the through holes, wherein the first sub-bearing substrate and second sub-bearing substrate are assembled such that the protrusions pass through the through holes, so that the protrusions are flush with a surface of the first sub-bearing substrate and spliced together with the surface to form a bearing surface;

forming an adhesive layer on the bearing surface, forming a flexible substrate on the adhesive layer, and forming a display element on the flexible substrate, separating the first sub-bearing substrate of the bearing substrate from the second sub-bearing substrate thereof, and removing the adhesive layer by flowing a cleaning liquid through the through holes in the first sub-bearing substrate, such that the first sub-bearing substrate is separated from the flexible substrate and the flexible display device is formed, wherein the cleaning liquid does not react with the first sub-bearing substrate and the flexible substrate.

2. The fabrication method as claimed in claim 1, wherein separating the first sub-bearing substrate of the bearing substrate from the second sub-bearing substrate thereof comprises:

separating the first sub-bearing substrate from the second sub-bearing substrate in a mechanistic fashion or by means of electrostatic force.

3. The fabrication method as claimed in claim 1, wherein an orthographic projection area of the second sub-bearing substrate is greater than that of the first sub-bearing substrate along a direction perpendicular to the bearing surface when the first sub-bearing substrate is assembled with the second sub-bearing substrate, wherein separating the first sub-bearing substrate of the bearing substrate from the second sub-bearing substrate thereof comprises:

applying an inert gas to an edge of the second sub-bearing substrate from above, so as to separate the first sub-bearing substrate from the second sub-bearing substrate by means of a gas pressure.

4. The fabrication method as claimed in claim 1, wherein a material of the adhesive layer comprises an organosilicon polymer material.

5. The fabrication method as claimed in claim 1, wherein the display element comprises one of an OLED display element and a liquid crystal display element.

6. The fabrication method as claimed in claim 1, wherein an orthographic projection area of the second sub-bearing substrate is greater than that of the first sub-bearing substrate along a direction perpendicular to the bearing surface when the first sub-bearing substrate is assembled with the second sub-bearing substrate.

7. The fabrication method as claimed in claim 1, wherein a height of each of the protrusions is equal to a depth of each of the through holes.

8. The fabrication method as claimed in claim 1, wherein a height of each of the protrusions is greater than a depth of each of the through holes.

9. The fabrication method as claimed in claim 8, wherein the bearing substrate further comprises a spacer layer covering a surface of the second sub-bearing substrate facing the first sub-bearing substrate, and the protrusions pass through the spacer layer; and wherein the height of the protrusions is equal to a sum of the depth of the through holes and a thickness of the spacer layer.

10. The fabrication method as claimed in claim 9, wherein a material for the spacer layer comprises resin.

11. The fabrication method as claimed in claim 1, wherein each of the through holes and the protrusions has a cylindrical shape.

* * * * *